US012300712B2

(12) United States Patent
Ting et al.

(10) Patent No.: US 12,300,712 B2
(45) Date of Patent: May 13, 2025

(54) BARRIER INFRARED DETECTOR ARCHITECTURE FOR FOCAL PLANE ARRAYS

(71) Applicant: California Institute of Technology, Pasadena, CA (US)

(72) Inventors: David Z. Ting, Arcadia, CA (US); Sam A. Keo, Pasadena, CA (US); Arezou Khoshakhlagh, Pasadena, CA (US); Alexander Soibel, South Pasadena, CA (US); Sarath D. Gunapala, Stevenson Ranch, CA (US)

(73) Assignee: California Institute of Technology, Pasadena, CA (US)

( * ) Notice: Subject to any disclaimer, the term of this patent is extended or adjusted under 35 U.S.C. 154(b) by 406 days.

(21) Appl. No.: 17/938,838

(22) Filed: Oct. 7, 2022

(65) Prior Publication Data
US 2023/0114881 A1  Apr. 13, 2023

Related U.S. Application Data

(60) Provisional application No. 63/253,406, filed on Oct. 7, 2021.

(51) Int. Cl.
H01L 27/146 (2006.01)
(52) U.S. Cl.
CPC ............... H01L 27/14652 (2013.01)
(58) Field of Classification Search
None
See application file for complete search history.

(56) References Cited

U.S. PATENT DOCUMENTS

| 4,679,063 | A | 7/1987 | White |
| 4,843,439 | A | 6/1989 | Cheng |
| 5,194,983 | A | 3/1993 | Voisin et al. |
| 5,536,948 | A | 7/1996 | Lee |
| 6,226,152 | B1 | 5/2001 | Tanaka et al. |
| 6,433,354 | B1 | 8/2002 | Kuan et al. |
| 6,455,908 | B1 | 9/2002 | Johnson et al. |

(Continued)

FOREIGN PATENT DOCUMENTS

| CN | 111900217 A | * 11/2020 | ..... H01L 31/022408 |
| WO | 2005004243 A1 | 1/2005 | |

(Continued)

OTHER PUBLICATIONS

International Preliminary Report on Patentability for International Application PCT/US2009/050268, Report issued Jan. 11, 2011, Mailed Jan. 20, 2011, 4 pgs.

(Continued)

Primary Examiner — Cory W Eskridge
(74) Attorney, Agent, or Firm — KPPB LLP

(57) ABSTRACT

Disclosed herein is an infrared detector. The detector includes a plurality of pixels. Each pixel includes an n-type semiconductor top contact layer, a p-type semiconductor layer electrically connected to the n-type top contact layer to form a top p-n junction, a unipolar electron barrier electrically connected to the p-type semiconductor layer, a bottom absorber, and an n-type semiconductor bottom contact layer electrically connected to the bottom absorber. The unipolar electron barrier is positioned between the p-type semiconductor layer and the bottom absorber.

20 Claims, 10 Drawing Sheets

(56) References Cited

U.S. PATENT DOCUMENTS

| | | | |
|---|---|---|---|
| 7,442,599 | B2 | 10/2008 | Maa et al. |
| 7,633,083 | B2 | 12/2009 | Lester et al. |
| 7,687,871 | B2 | 3/2010 | Maimon |
| 7,795,640 | B2 | 9/2010 | Klipstein |
| 7,928,473 | B2 | 4/2011 | Klipstein |
| 8,022,390 | B1 | 9/2011 | Kim et al. |
| 8,217,480 | B2 | 7/2012 | Ting et al. |
| 8,410,523 | B2 | 4/2013 | Huffaker et al. |
| 8,928,029 | B2 | 1/2015 | Ting et al. |
| 9,214,581 | B2 | 12/2015 | Arezou et al. |
| 9,647,164 | B2 | 5/2017 | Ting et al. |
| 9,799,785 | B1 | 10/2017 | Ting et al. |
| 9,831,372 | B2 | 11/2017 | Khoshakhlagh et al. |
| 10,872,987 | B2 | 12/2020 | Ting et al. |
| 2002/0027238 | A1 | 3/2002 | Lin et al. |
| 2003/0064248 | A1 | 4/2003 | Wolk et al. |
| 2003/0209708 | A1 | 11/2003 | Kubota |
| 2007/0215900 | A1 | 9/2007 | Maimon |
| 2007/0235758 | A1 | 10/2007 | Klipstein |
| 2008/0111152 | A1 | 5/2008 | Scott et al. |
| 2009/0084958 | A1 | 4/2009 | Vogt |
| 2009/0127462 | A1 | 5/2009 | Gunapala et al. |
| 2009/0224228 | A1 | 9/2009 | Razeghi |
| 2009/0256231 | A1 | 10/2009 | Klipstein |
| 2010/0006822 | A1 | 1/2010 | Ting et al. |
| 2010/0072514 | A1 | 3/2010 | Ting et al. |
| 2010/0155777 | A1 | 6/2010 | Hill et al. |
| 2010/0230720 | A1 | 9/2010 | Wicks |
| 2011/0037097 | A1 | 2/2011 | Scott et al. |
| 2012/0022362 | A1 | 1/2012 | Caruba et al. |
| 2012/0145996 | A1 | 6/2012 | Ting et al. |
| 2012/0199185 | A1 | 8/2012 | Yang |
| 2013/0062593 | A1 | 3/2013 | Jones et al. |
| 2013/0146998 | A1 | 6/2013 | Ting et al. |
| 2014/0225064 | A1 | 8/2014 | Khoshakhlagh et al. |
| 2014/0332755 | A1* | 11/2014 | Wei ............ H01L 31/03046 257/21 |
| 2014/0374701 | A1 | 12/2014 | Wei |
| 2015/0145091 | A1 | 5/2015 | Ting et al. |
| 2016/0336476 | A1 | 11/2016 | Khoshakhlagh et al. |
| 2019/0013427 | A1 | 1/2019 | Ting et al. |
| 2023/0129191 | A1 | 4/2023 | Hill et al. |

FOREIGN PATENT DOCUMENTS

| | | |
|---|---|---|
| WO | 2008061141 A1 | 5/2008 |
| WO | 2010006269 A1 | 1/2010 |

OTHER PUBLICATIONS

International Search Report and Written Opinion for International Application No. PCT/US2009/050268, Search completed Sep. 27, 2009, Mailed Oct. 7, 2009, 5 pgs.

Arias et al., "HgCdTe dual-band infrared photodiodes grown by molecular beam epitaxy", Journal of Applied Physics, vol. 70, No. 8, Oct. 15, 1991, pp. 4620-4622, doi: 10.1063/1.349099.

Ashley et al., "Operation and properties of narrow-gap semiconductor devices near room temperature using non-equilibrium techniques", Semiconductor Science and Technology, vol. 6, No. 12C, 1991, pp. C99-C105, doi: 10.1088/0268-1242/6/12c/020.

Blazejewski et al., "Bias-switchable dual-bank HgCdTe infrared photodetector", Journal of Vacuum Science & Technology B, vol. 10, No. 4, 1626, Jul. 1, 1992, pp. 1626-1632, doi: 10.1116/1.586259.

Byun et al., "Heterojunction fabrication by selective area chemical vapor deposition induced by synchrotron radiation", Applied Physics Letters, vol. 64, No. 15, Apr. 11, 1994, pp. 1968-1970, doi: 10.1063/1.111758.

Carras et al., "Generation-recombination reduction in InAsSb photodiodes", Semiconductor Science and Technology, vol. 21, No. 12, Nov. 9, 2006, pp. 1720-1723, doi: 10.1088/0268-1242/21/12/037.

Carras et al., "Interface band gap engineering in InAsSb photodiodes", Applied Physics Letters, vol. 87, No. 10, Sep. 1, 2005, p. 102103-1-102103-3, doi: 10.1063/1.2041818.

Gautam et al., "Performance improvement of longwave infrared photodetector based on type-II InAs/GaSb superlattices using unipolar current blocking layers", Applied Physics Letters, vol. 96, No. 23, 231107, Jun. 8, 2010, pp. 231107-1-231107-3, doi: 10.1063/1.3446967.

Ghosh et al., "Fabrication of the SnS/ZnO heterojunction for PV applications using electrodeposited ZnO films", Semiconductor Science and Technology, vol. 24, No. 2, Jan. 20, 2009, pp. 025024-1-025024-7, doi: 10.1088/0268-1242/24/2/025024.

Gotoh et al., "Molecular Beam Epitaxy of AlSb on GaAs and GaSb on AlSb Films", Physica Status Solidi (a), vol. 75, No. 2, Jun. 1, 1983, pp. 641-645, doi: 10.1002/pssa.2210750239.

Hill et al., "Demonstration of large format mid-wavelength infrared focal plane arrays based on superlattice and BIRD detector structures", Infrared Physics & Technology, vol. 52, No. 6, Nov. 2009, pp. 348-352, doi: 10.1016/j.infrared.2009.09.007.

Hoffman et al., "The effect of doping the M-barrier in very longwave type II in As/GaSb heterodiodes", Applied Physics Letters, vol. 93, No. 3, 031107, Jul. 23, 2008, 3 pgs., doi: 10.1063/1.2963980.

Hoglund et al., "Influence of radiative and non-radiative recombination on the minority carrier lifetime in midwave infrared InAs/InAsSb superlattices", Applied Physics Letters, vol. 103, No. 22, 221908, Nov. 26, 2013, p. 221908-1-221908-5, doi: 10.1063/1.4835055.

Huang et al., "Epitaxial growth and characterization of InAs/GaSb and InAs/InAsSb type-II superlattices on GaSb substrates by metalorganic chemical vapor depositions for long wavelength infrared photodetectors", Journal of Crystal Growth, vol. 314, No. 1, Jan. 2011, pp. 92-96, doi: 10.1016/j.jcrysgro.2010.11.003.

Huang et al., "Strain relief by periodic misfit arrays for low defect density GaSb on GaAs", Applied Physics Letters, vol. 88, No. 13, 131911, Mar. 30, 2006, pp. 131911-1-131911-3, doi: 10.1063/1.2172742.

Johnson et al., "Electrical and optical properties of infrared photodiodes using the InAs/Ga1-xInXSb superlattice in heterojunctions with GaSb", Journal of Applied Physics, vol. 80, No. 2, Jul. 15, 1996, pp. 1116-1127, doi: 10.1063/1.362849.

Kazzi et al., "Interplay between Sb flux and growth temperature during the formation of GaSb islands on GaP", Journal of Applied Physics, vol. 111, No. 12, 123506, Jun. 19, 2012, pp. 123506-1-123506-5, doi: 10.1063/1.4729548.

Khoshakhlagh et al., "Long-Wave InAs/GaSb Superlattice Detectors Based on nBn and Pin Designs", IEEE Journal of Quantum Electronics, vol. 46, No. 6, Jun. 6, 2010, pp. 959-964, doi: 10.1109/jqe.2010.2041635.

Khoshakhlagh et al., "Bias dependent dual band response from InAs/Ga(In)Sb type II strain layer superlattice detectors", Applied Physics Letters, vol. 91, No. 26, Dec. 27, 2007, pp. 263504-1-263504-3, doi: 10.1063/1.2824819.

Kim et al., "Long-wave infrared nBn photodetectors based on INAs/InAsSb type-II superlattices", Applied Physics Letters, vol. 101, No. 16, 161114, Oct. 18, 2012, pp. 161114-1-161114-3, doi: 10.1063/1.4760260.

Kim et al., "Mid-IR focal plane array based on type-II InAs/GaSb strain layer superlattice detector with nBn design", Applied Physics Letters, vol. 92, No. 18, 183502, May 7, 2008, pp. 183502-1-183502-3, doi: 10.1063/1.2920764.

Klipstein, "XBn" Barrier Photodetectors for High Sensitivity and High Operating Temperature Infrared Sensors, Proceedings of SPIE, Infrared Technology and Applications XXXIV, vol. 6940, Apr. 2008, pp. 69402U-1-69402U-12, doi: 10.1117/12.778848.

Klipstein et al., "XBn" Barrier Detectors for High Operating Temperatures, Proceedings of SPIE, Quantum Sensing and Nanophotonic Devices VII, vol. 7608, 76081V, Jan. 22, 2010, pp. 76081V-1-76081V-10, doi: 10.1117/12.841585.

Lackner et al., "Growth of InAsSb/InAs MQWs on GaSb for mid-IR photodetector applications", Journal of Crystal Growth, vol. 311, No. 14, May 5, 2009, pp. 3563-3567, doi: 10.1016/j.jcrysgro.2009.04.027.

(56) References Cited

OTHER PUBLICATIONS

Lackner et al., "InAsSb and InPSb Materials for Mid Infrared Photodetectors", 22nd International Conference on Indium Phosphide and Related Materials (IPRM), 2010, 4 pgs., doi: 10.1109/ICIPRM.2010.5515974.

Lackner et al., "Strain balanced InAs/InAsSb superlattice structures with optical emission to 10 um", Applied Physics Letters, vol. 95, No. 8, 081906, Aug. 26, 2009, pp. 081906-1-081906-3, doi: 10.1063/1.3216041.

Lin et al., "Minority Carrier Lifetime in Beryllium-Doped InAs/InAsSb Strained Layer Superlattices", Journal of Electronic Material, vol. 43, No. 9, Jun. 3, 2014, pp. 3184-3190, doi: 10.1007/s11664-014-3239-6.

Magden, "Effects of Strain Release via Interfacial Misfit Arrays on the Optical Properties of GaSb/GaAs Heterojunctions", Senior Honors Thesis, 2012, 59 pgs.

Maimon et al., "InAsSb/GlaAISb/1nAsSb nBn IR detector for the 3-5μm", Abstract Book of the 11th International Conference on Narrow Gap Semiconductors, Buffalo, New York, 2003, p. 70.

Maimon et al., "nBn detector, an infrared detector with reduced dark current and higher operating temperature", Applied Physics Letters, vol. 89, No. 15, 151109, Oct. 10, 2006, pp. 151109-1-151109-3, doi: 10.1063/1.2360235.

Marozas et al., "Surface dark current mechanisms in III-V infrared photodetectors [Invited]", Optical Materials Express, vol. 8, No. 6, 1419, Jun. 1, 2018, pp. 1419-1424, doi: 10.1364/ome.8.001419.

Nguyen et al., "Background limited long wavelength infrared type-II InAs/SaSb superlattice photodiodes operating at 110 K", Applied Physics Letter, vol. 93, No. 12, 123502, Sep. 22, 2008, pp. 123502-1-123502-3, doi: 10.1063/1.2978330.

Nguyen et al., "Dark current suppression in type II InAs/GaSb superlattice long wavelength infrared photodiodes with M-structure barrier", Applied Physics Letters, vol. 91, No. 16, 163511, Oct. 18, 2007, 3 pgs., doi: 10.1063/1.2800808.

Plis et al., "Lateral diffusion of minority carriers in nBn based type-II InAs/GaSb strained layer superlattice detectors", Applied Physics Letters, vol. 93, No. 12, 123507, Sep. 24, 2008, pp. 123507-1-123507-3, doi: 10.1063/1.2990049.

Plis et al., "Lateral diffusion of minority carriers in InAsSb-based nBn detectors", Applied Physics Letters, vol. 97, No. 12, Sep. 22, 2010, pp. 123503-1-123503-3, doi: 10.1117/12.873316.

Reine et al., "Independently Accessed Back-to-Back HgCdTe Photodiodes: A New Dual-Band Infrared Detector", Journal of Electronic Materials, vol. 24, No. 5, May 1995, pp. 669-679, doi: 10.1007/BF02657977.

Reverchon et al., "Design and fabrication of infrared detectors based on lattice-matched InAs0.91Sb0.09 on GaSb", Physica E: Low-Dimensional Systems and Nanostructures, vol. 20, No. 3-4, Jan. 2004, pp. 519-522. doi: 10.1016/j.physe.2003.09.001.

Reyner et al., "Characterization of GaSb/GaAs interfacial misfit arrays using x-ray diffraction", Applied Physics Letters, vol. 99, No. 23, 231906, Dec. 8, 2011, pp. 231906-1-231906-3, doi: 10.1063/1.3666234.

Rogalski, "Heterostructure infrared photovoltaic detectors", Infrared Physics & Technology, vol. 41, No. 4, Feb. 18, 2000, pp. 213-238, doi: 10.1016/s1350-4495(00)00042-6.

Savich et al., "Dark current filtering in unipolar barrier infrared detectors", Applied Physics Letters, vol. 99, 121112, Sep. 22, 2011, pp. 121112-1-121112-3, doi: 10.1063/1.3643515.

Steenbergen et al., "Significantly improved minority carrier lifetime observed in a long-wavelength infrared III-V type-II superlattice comprised of InAs/InAsSb", Applied Physics Letters, vol. 99, No. 25, 251110, Dec. 22, 2011, pp. 251110-1-251110-3, doi: 10.1063/1.3671398.

Tatebayashi et al., "Monolithically Integrated III-Sb-Based Laser Diodes Grown on Miscut Si Substrates", IEEE Journal of Selected Topics in Quantum Electronics, vol. 15, No. 3, May/Jun. 2009, pp. 716-723, doi: 10.1109/jstqe.2009.2015678.

Tennant, "Rule 07" Revisited: Still a Good Heuristic Predictor of p/n HgCdTe Photodiode Performance?, Journal of Electronic Materials, vol. 39, No. 7, Feb. 6, 2010, pp. 1030-1035, doi: 10.1007/s11664-010-1084-9.

Ting et al., "Antimonide superlattice barrier infrared detectors", Proceedings of SPIE, Infrared Systems and Photoelectronic Technology IV, vol. 7419, 74190B, Aug. 27, 2009, pp. 74190B-1-74190B-12, doi: 10.1117/12.829047.

Ting et al., "A high-performance long wavelength superlattice complementary barrier infrared detector", Applied Physics Letters, vol. 95, No., 2, 023508, Jul. 16, 2009, pp. 023508-1-023508-3, doi: 10.1063/1.3177333.

Ting et al., "Development of type-II superlattice long wavelength infrared focal plane arrays for land imaging", Infrared Physics & Technology, vol. 123, 104133, Jun. 2022, 26 pgs.

Ting et al., "Exclusion, extraction, and junction placement effects in the complementary barrier infrared detector", Applied Physics Letters, vol. 102, No. 12, Mar. 26, 2013, pp. 121109-1-121109-4, doi: 10.1063/1.4798551.

Ting et al., "Long wavelength InAs/InAsSb superlattice barrier infrared detectors with p-type absorber quantum efficiency enhancement", Applied Physics Letters, vol. 118, No. 13, 133503, Mar. 30, 2021, pp. 133503-1-133503-5, doi: 10.1063/5.0047937.

Ting et al., "Mid-wavelength high operating temperature barrier infrared detector and focal plane array.", Applied Physics Letters, vol. 113, No. 2, 021101, Jul. 10, 2018, pp. 021101-1-021101-4, doi: 10.1063/1.5033338.

Wang et al., "Strain relief at the GaSb/GaAs interface versus substrate surface treatment and AISb interlayers thickness", Journal of Applied Physics, vol. 109, No. 2, 023509, Jan. 19, 2011, pp. 023509-1-023509-6, doi: 10.1063/1.3532053.

Weiss et al., "InAsSb-based XBnn bariodes grown by molecular beam epitaxy on GaAs", Journal of Crystal Growth, vol. 339, No. 1, Jan. 2012, pp. 31-35, doi: 10.1016/j.jcrysgro.2011.11.076.

Wicks et al., "Infrared detector epitaxial designs for suppression of surface leakage current", Proceedings of SPIE: Quantum Sensing and Nanophotonic Devices VII, vol. 7608, 760822, Jan. 23, 2010, pp. 760822-1-760822-8, doi: 10.1117/12.842427.

Wilk et al., "Type-II InAsSb/InAs strained quantum-well laser diodes emitting at 3.2um", Applied Physics Letters, vol. 77, No. 15, Oct. 9, 2000, pp. 2298-2300, doi: 10.1063/1.1317537.

Zhang, "Continuous wave operation of InAS/InAsxsb1-x midinfrared lasers", Applied Physics Letters, vol. 66, No. 2, Jan. 9, 1995, pp. 118-120, doi: 10.1063/1.113535.

Zhang, "InAs/InAsxSb1-x type-II superlattice Midwave Infrared Lasers", Antimonide-Related Strained-Layer Heterostructures, edited by M. O. Manasreh, Gordon and Breach Science Publishers, Amsterdam, 1997, 10 pgs.

Zhou et al., "Molecular Beam Epitaxy of GaSb on GaAs Substrates with AISb Buffer Layers", Chinese Physics Letters, vol. 26, No. 1, 018101, 2009, pp. 01810-1-01810-3, doi: 10.1088/0256-307x/26/1/018101.

* cited by examiner

BARRIER INFRARED DETECTOR ARCHITECTURE FOR FOCAL PLANE ARRAYS

CROSS-REFERENCE TO RELATED APPLICATIONS

This application claims the benefit of and priority under 35 U.S.C. § 119 (e) to U.S. Provisional Patent Application Ser. No. 63/253,406 entitled "Barrier Infrared Detector Architecture for Focal Plane Arrays," filed Oct. 7, 2021, which is incorporated herein by reference in its entirety for all purposes.

STATEMENT OF FEDERAL SUPPORT

This invention was made with government support under Grant No. 80NMO0018D0004 awarded by NASA (JPL). The government has certain rights in the invention.

FIELD OF THE INVENTION

The present invention generally relates to detectors including unipolar barriers. More specifically, this disclosure relates to infrared detectors.

BACKGROUND

Infrared photodetectors may utilize a p-n junction diode architecture. There are typically two major concerns when implementing a p-n junction photodiode using III-V semiconductor infrared absorbers: 1) Generation-recombination dark current, and, 2) Surface leakage dark current. Generation-recombination (G-R) dark current is due to Shockley-Read-Hall (SRH) processes in the depletion layer surrounding the p-n junction. Surface leakage in III-V semiconductor p-n junction infrared photodiodes can occur when, for example, the surface conductivity type is entirely n-type. Common examples are found in diodes with absorbers made from InAs or InAs-rich alloy semiconductors, which have degenerate n-type surfaces even when they are doped p-type. Some nBn photodetector architectures provide lower G-R dark current by suppressing SRH processes, and by reducing surface leakage dark current.

SUMMARY OF THE INVENTION

Systems and methods in accordance with various embodiments of the invention may include an infrared detector array including: a plurality of pixels, wherein each pixel including:
an n-type semiconductor top contact layer;
a p-type semiconductor layer electrically connected to the n-type top contact layer to form a top p-n junction;
a unipolar electron barrier electrically connected to the p-type semiconductor layer;
a bottom absorber, wherein the unipolar electron barrier is positioned between the p-type semiconductor layer and the bottom absorber; and
an n-type semiconductor bottom contact layer electrically connected to the bottom absorber.

In various other embodiments, the bottom absorber includes a p-type semiconductor absorber layer.

In still various other embodiments, the bottom absorber further includes a n-type semiconductor absorber layer which forms a p-n junction with the p-type semiconductor absorber layer.

In still various other embodiments, the infrared detector array further includes a window layer which is positioned between the p-type semiconductor absorber layer and the n-type semiconductor bottom contact layer.

In still various other embodiments, the window layer includes an n-type semiconductor window layer.

In still various other embodiments, the window layer further includes a p-type semiconductor window layer which forms a p-n junction with the n-type semiconductor window layer.

In still various other embodiments, a first p-type transition layer is positioned between the p-type semiconductor layer and the unipolar electron barrier.

In still various other embodiments, a second p-type transition layer is positioned between the unipolar electron barrier and the bottom absorber.

In still various other embodiments, each n-type semiconductor top contact layer and p-type semiconductor layer are physically separated from each other.

In still various other embodiments, each unipolar electron barrier is physically separated from each other.

In still various other embodiments, each bottom absorber includes a monolithic p-type absorber semiconductor layer.

In still various other embodiments, the monolithic p-type absorber semiconductor layer includes a plurality of cavities which do not extend beyond the monolithic p-type absorber semiconductor layer.

In still various other embodiments, the plurality of cavities overlap with gaps between each n-type semiconductor top contact layer and p-type semiconductor layer.

In still various other embodiments, each unipolar electron barrier combined to form a monolithic layer.

In still various other embodiments, the monolithic layer comprises a plurality of cavities which do not extend beyond the monolithic layer.

In still various other embodiments, the plurality of cavities overlap gaps between each n-type semiconductor top contact layer and p-type semiconductor layer.

In still various other embodiments, the p-type semiconductor layer includes a recombination layer and wherein the top p-n junction electrically isolates each pixel from adjacent pixels.

In still various other embodiments, the absorber layer has a bandgap which is smaller than the recombination layer.

In still various other embodiments, the recombination layer includes a thickness of 1 micron or less.

In still various other embodiments, the recombination layer includes a thickness between 1 micron and 0.8 microns.

In still various other embodiments, the absorber layer is configured to absorb radiation of wavelengths that are longer than the wavelengths of radiation that the recombination layer is capable of absorbing.

In still various other embodiments, the bottom absorber layer includes a superlattice structure.

In still various other embodiments, the superlattice structure includes an InAs/InAsSb type-II superlattice.

In still various other embodiments, the unipolar electron barrier is configured to block the flow of electrons while allowing the flow of holes.

In still various other embodiments, exposed surface of the n-type semiconductor top contact layer and the p-type semiconductor layer include n-type semiconductor exposed surfaces.

In still various other embodiments, exposed surfaces of the unipolar electron barrier do not include an n-type semiconductor.

In still various other embodiments, the infrared detector array further includes an n-type semiconductor layer positioned between the n-type semiconductor top contact layer and the p-type semiconductor layer, where the n-type semiconductor layer and the p-type semiconductor layer form a top absorber which is configured to absorb a different wavelength of light than the bottom absorber.

In still various other embodiments, exposed surface of the n-type semiconductor top contact layer, the p-type semiconductor layer, and the n-type semiconductor layer comprise n-type semiconductor exposed surfaces.

In still various other embodiments, exposed surfaces of the unipolar electron barrier do not include an n-type semiconductor.

Further, systems and methods in accordance with various embodiments of the invention may include a focal plane array including: the infrared detector array described above; and a silicon readout integrated circuit electrically connected to the infrared detector array.

BRIEF DESCRIPTION OF THE DRAWINGS

The description will be more fully understood with reference to the following figures and data graphs, which are presented as various embodiment of the disclosure and should not be construed as a complete recitation of the scope of the disclosure, wherein.

DETAILED DESCRIPTION

Figure 1:
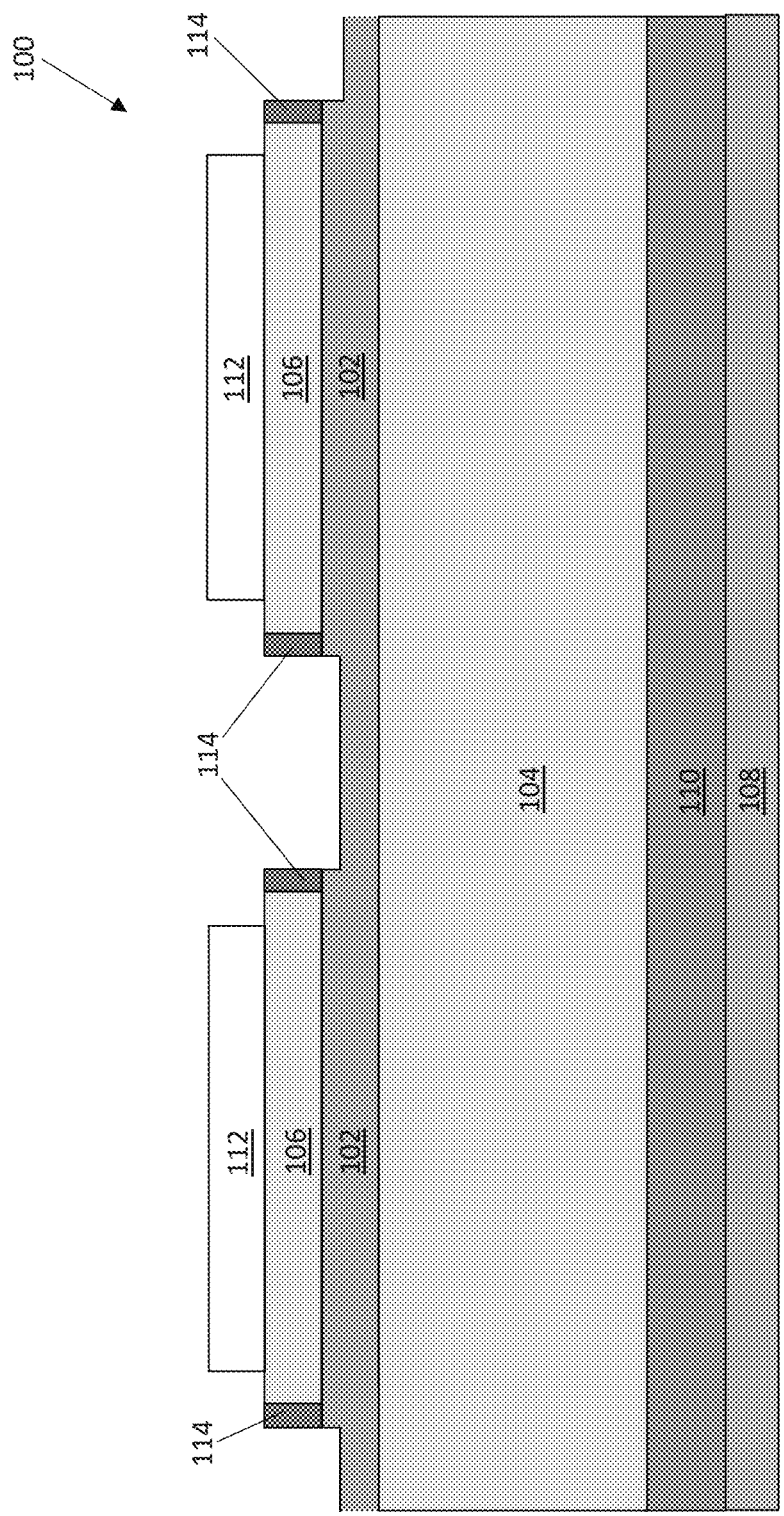
FIG. 1 is a schematic of two adjacent pixels in a detector array made from an nBn infrared photodiode structure.

Various embodiments of this disclosure relate to infrared detector structures. FIG. 1 is a schematic of two adjacent pixels in a detector array 100 made from an nBn infrared photodiode structure. The detector array 100 includes a unipolar electron barrier 102 and an n-type absorber 104 surrounded by a top contact layer 106 and a bottom contact layer 108. Radiation is absorbed by the n-type absorber 104 which creates a current which may be utilized to sense radiation such as infrared light. Depending on the bandgap of the n-type absorber 104, different wavelengths of radiation may be absorbed. The top contact layer 106 and the bottom contact layer 108 may be n-type semiconductors. The unipolar electron barrier 102 may be undoped or lightly doped. The pixel etch depth in the nBn detector array 100 extends into but not beyond the unipolar electron barrier layer 102. A window 110 may be positioned between the n-type absorber 104 and the bottom contact layer 108. The window 110 may be an n-type semiconductor. A metal top contact 112 may be positioned above the top contact layer 106. It has been discovered that certain exposed surfaces of semiconductor layers produce an n-type exposed surfaces 114. Without limitation to any particular theory, exposed surfaces of some types of semiconductor layers include dangling bonds which may produce the n-type exposed surfaces 114. For example, exposed surfaces of InAs produce n-type exposed surfaces. However, exposed surfaces of GaSb produce p-type exposed surfaces. The n-type exposed surfaces 114 may be present in the top contact layer 106. The unipolar electron barrier 102 may be utilized to decrease surface leakage by disrupting the n-type exposed surfaces 114 which disrupts the current through the n-type semiconductor surface 114.

In some embodiments, the top contact layer 106 may be a p-type semiconductor which would make the detector array 100 made from an pBn infrared photodiode structure.

A unipolar barrier blocks one carrier type (electron or hole) but allows the unimpeded flow of the other. A unipolar electron barrier 102 blocks the flow of electrons but allows the flow of holes. In addition, the exposed surface of the unipolar electron barrier 102 may suppress surface conduction of electrons.

As illustrated in FIG. 1, the individual pixels in an nBn focal plane array (FPA) can be delineated with a shallow etch process that stops at the wide-bandgap unipolar electron barrier 102. Since there is no exposed absorber surface, surface currents are essentially eliminated even without additional surface passivation.

Figure 2:
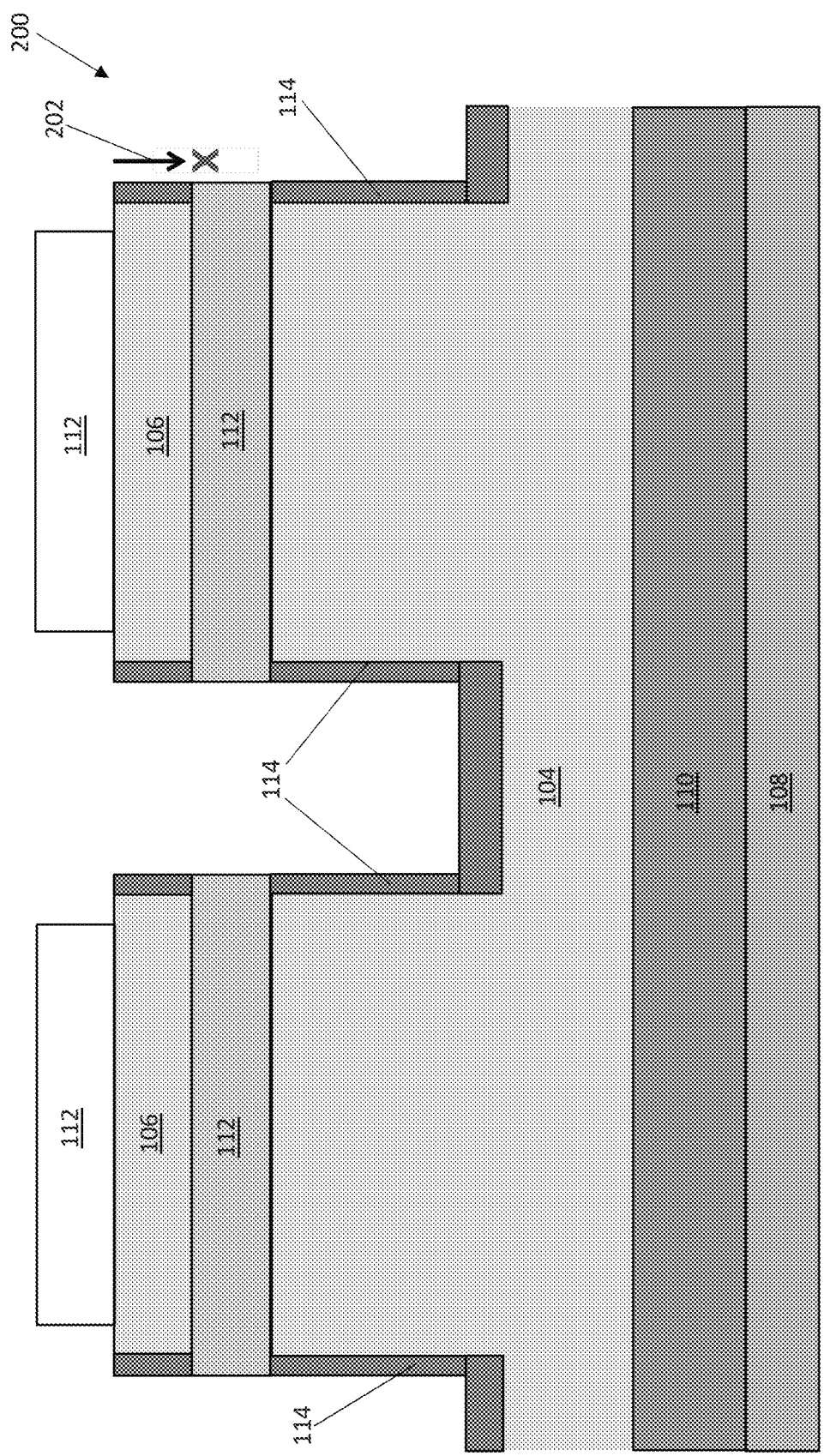
FIG. 2 is a schematic of two adjacent pixels in a detector array made from an nBn infrared photodiode structure.

FIG. 2 is a schematic of two adjacent pixels in a detector array 200 made from an nBn infrared photodiode structure. The detector array 200 includes many identically labeled elements as the detector array 100 described in connection with FIG. 1. The description from FIG. 1 is applicable to the detector array 200 of FIG. 2 and this description will not be repeated in detail. Unlike the detector array 100 of FIG. 1, the pixel etch depth in this nBn detector array 200 extends to below unipolar electron barrier layer 102 and into the n-type absorber layer 104.

As illustrated in FIG. 2, pixel delineation in an nBn FPA can also be accomplished by etching past the unipolar electron barrier; this process would leave exposed absorber sidewall surfaces. The n-type absorber 104 may be InAs, InAsSb, or InAs/InAsSb type-II superlattices that have n-type exposed surfaces 114, which can provide an electron surface leakage pathway. However, in an nBn device, the electron surface leakage pathway 202 along the n-type exposed surfaces 114 may be disrupted by the unipolar electron barrier layer 102, and therefore surface leakage current may be suppressed. In addition, the presence of the unipolar electron barrier is known to suppress G-R dark current. Since III-V semiconductors may suffer from having short SRH minority carrier lifetimes and the lack of good surface passivation, the unipolar electron barrier layer 102 may be especially beneficial for III-V semiconductor based infrared photodiodes.

The detector array may be utilized as a type-II superlattice (T2SL) "barrier infrared detector" (BIRD). Examples of T2SL BIRDs are described in U.S. Pat. No. 8,217,480, entitled "Barrier Infrared Detector" and filed Aug. 3, 2011, which is hereby incorporated by reference in its entirety. As described, T2SL BIRDs may include superlattice infrared absorber(s) paired with matching unipolar barrier(s). Among a number of exemplary structures disclosed is an nBn detector with InAs/InAsSb T2SL absorber. Further, U.S. Pat. No. 8,217,480 discusses various combinations of unipolar electron barriers and superlattice absorbers which are incorporated by reference into this application. For example, the section "Electron Unipolar Barriers" includes a description of a unipolar electron barrier "for the typical InAs/InAsSb superlattice is either the AlAsSb or the AlGaSb ternary alloy." The same section describes many other examples of combinations of superlattice absorbers and unipolar electron barriers. One advantage of the InAs/InAsSb T2SL absorber is that its bandgap can be adjusted continuously to provide cutoff wavelengths ranging from approximately 4 μm to beyond 15 μm, thereby providing a high degree of versatility. FPAs based on the InAs/InAsSb T2SL unipolar barrier infrared detector have been particularly successful in the mid-wavelength infrared (MWIR), having demonstrated a 40 to 50 K operating temperature advantage over the market-leading MWIR InSb FPAs. However, one disadvantage for the T2SL absorber is that its hole mobility can become quite low as the cutoff wavelength increases into the long-wavelength infrared (LWIR). In particular, an n-type absorber 104 in an nBn detector relies on hole transport, and therefore may suffer from short diffusion length, which limits the thickness of the absorber. As a result, LWIR detectors using n-type T2SL absorbers, such as those based on the nBn or pBn device architectures, suffer from relatively short hole diffusion lengths, which limits the absorber thickness, and results in relatively low quantum efficiency (QE). In some examples, grading the absorber bandgap may assist the collection of minority carriers (holes). While this can enhance the QE to some extent, it is still often inadequate in the case of LWIR detectors.

A pBp device structure, with p-type T2SL absorber and a matching unipolar hole barrier can be used to achieve higher QE since the T2SL electron diffusion length is longer than the hole diffusion length. However, it has been discovered that if the surface of the p-type T2SL absorber inverts to n-type, which is the case for the InAs/InAsSb T2SL, the dark current in the pBp device structure can be high, since a unipolar hole barrier may not block the electron surface shunt current.

Figure 3:
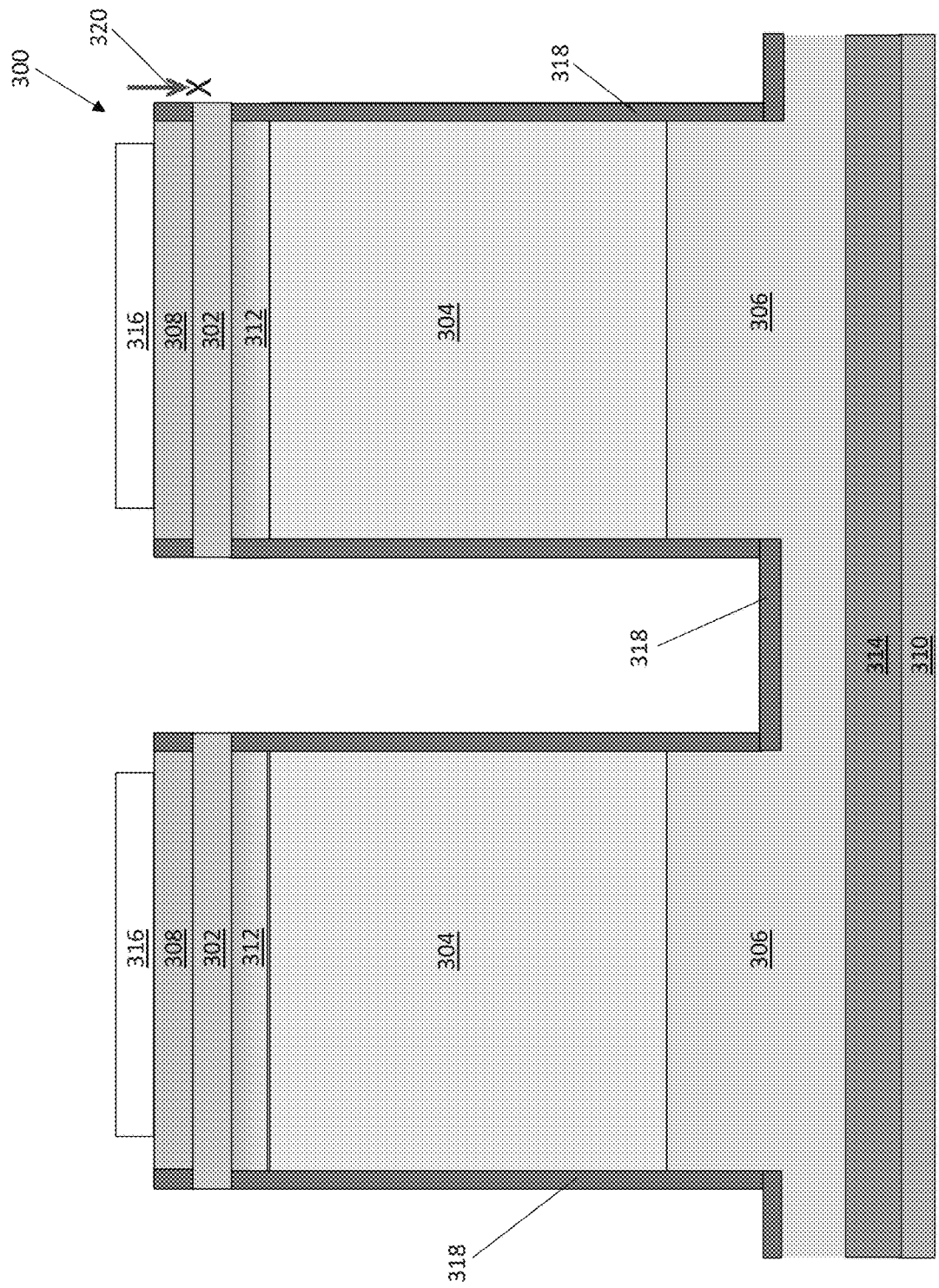
FIG. 3 is a schematic of two adjacent pixels in a detector array made from an exemplary p$^+$BpnWn$^+$ infrared photodiode.

FIG. 3 is a schematic of two adjacent pixels in a detector array 300 made from an exemplary p$^+$BpnWn$^+$ infrared photodiode. The p$^+$BpnWn$^+$ detector structure includes a unipolar electron barrier 302, a p-type absorber region 304, and n-type absorber region 306, surrounded by a top contact layer 308 and a bottom contact layer 310. The top contact layer 308 may be a p-type semiconductor and the bottom contact layer 310 may be an n-type semiconductor. The absorber regions 304, 306 absorb radiation such as IR light which may create photo-generated carriers.

A thin transition layer 312 may be interposed between the unipolar electron barrier 302 and the p-type absorber region 304. A unipolar hole barrier layer 314, which can act as a window layer, may be interposed between the n-type absorber layer 306 and the n-type bottom contact layer 310. The pixel mesa etch depth extends to below the p-n junction of the p-type absorber region 304 and the n-type absorber region 306. A metal top contact 316 may be positioned above the top contact layer 308. As with the structure of FIGS. 1 and 2, n-type exposed surfaces 318 may surround the top contact layer 308, the transition layer 312, the p-type absorber region 304, and the n-type absorber region 306. The n-type exposed surfaces 318 may cause electron surface current to flow which may increase the amount of dark current. The unipolar electron barrier 302 may sever an electron surface leakage pathway 320 by providing a barrier to the electron surface current.

Various solutions to the problem of limited LWIR quantum efficiency are disclosed in U.S. Pat. No. 10,872,987, entitled "Enhanced quantum efficiency barrier infrared detectors" and filed Dec. 12, 2016 which is hereby incorporated by reference in its entirety. This design includes a p$^+$BpnWn$^+$ device structure, which may be considered as a p$^+$BnWn$^+$ device with an extra p-type absorber layer inserted between the unipolar electron barrier layer "B" and the n-type absorber layer "n"; this is sometimes referred to as a "p-insert" structure. The p$^+$BpnWn$^+$ structure benefits from QE contributions from the n-type absorber layer, as well as from the additional p-type absorber layer, which can be made thicker than the n-type absorber layer because of the longer electron diffusion length. To physically delineate and electrically isolate the individual pixels in a detector array made from a p$^+$BpnWn$^+$ structure, the mesas are delineated by etching to below the p-n junction, as illustrated in FIG. 3.

The p$^+$BpnWn$^+$ structure may be compared with another structure that use only a p-type absorber, whose thickness is the same as the total thickness of the p-type and n-type absorbers in the p$^+$BpnWnt. If both structures are properly designed, they should absorb the same amount of infrared light and yield approximately the same QE. However, since the pixel etch extends to below the p-type absorber section and into the n-type semiconductor below, the p$^+$BpnWn$^+$ benefits from a reduced etch depth and reduced area of exposed p-type absorber surface when compared to device structures that use a p-type absorber only. Nevertheless, the pixel etch in the p$^+$BpnWn$^+$ structure still leaves the entire length of the p-type absorber layer as well as a part of the n-type absorber layer with exposed sidewalls. It would be beneficial to decrease the amount of exposed absorber surface and more specifically the exposed p-type absorber surface as this creates unwanted defects and surface related dark current. Further, it would be beneficial to keep the absorber p-n junction unexposed as this is a further source of surface defect related dark current.

Although the surface shunt dark current is blocked by the unipolar electron barrier "B" 302, without adequate passivation, the exposed absorber sidewalls are still sources of other surface related dark currents. This is especially problematic when the p-type absorber exposed surface inverts to n-type as discussed above and is the case of InAs, InAsSb, and the InAs/InAsSb T2SL. In practice, LWIR detectors based on the p$^+$BpnWn$^+$ architecture has higher QE but also higher dark current density than those based on nBn or pBn architectures. Another drawback of the p$^+$BpnWn$^+$ is the inclusion of an exposed p-n homojunction in the absorber, which is an additional source of dark current. It would be beneficial to achieve enhanced QE without incurring surface dark current penalties.

Various Device Structures

Figure 4:
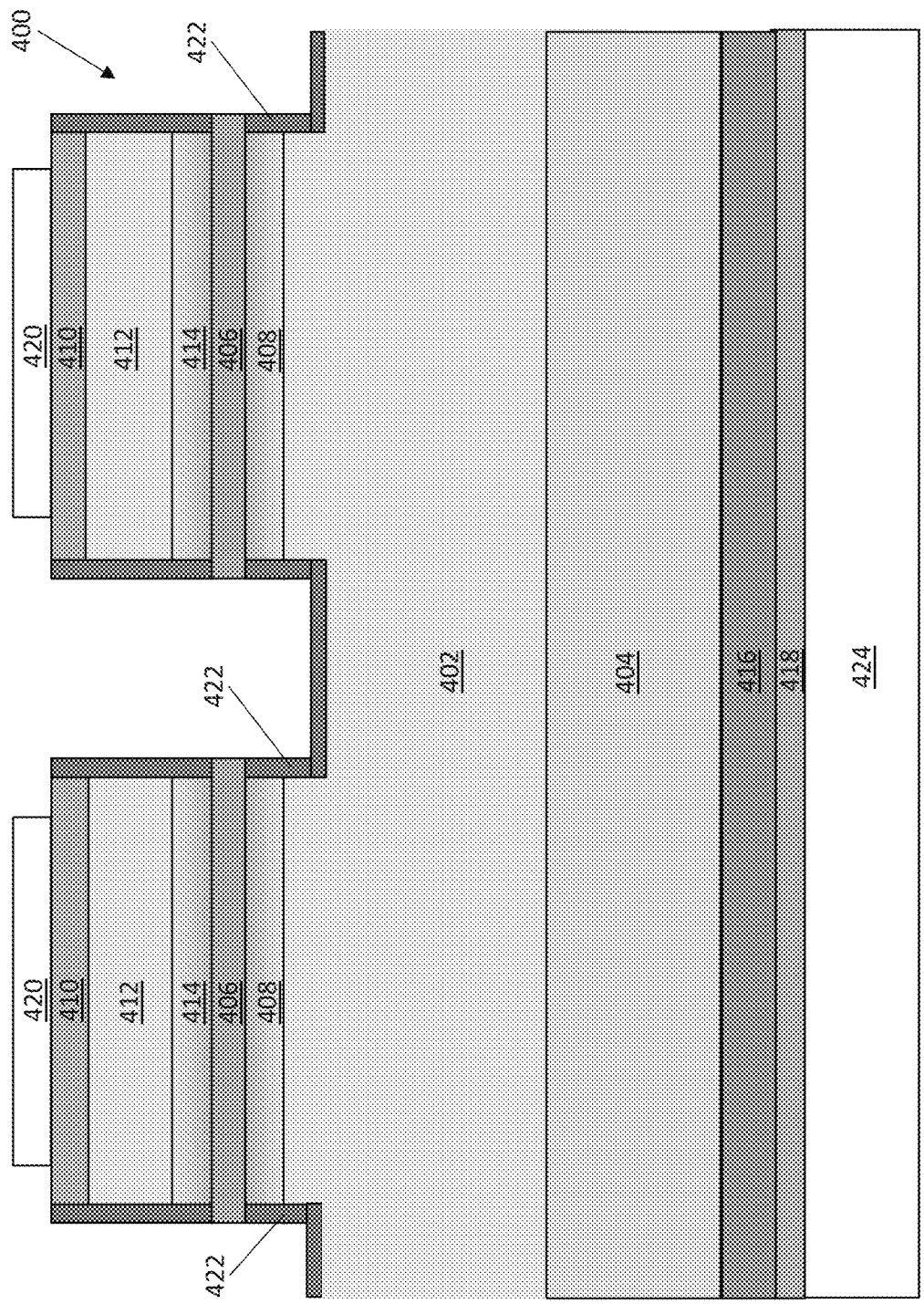
FIG. 4 is a schematic of two adjacent pixels in a detector array made from an n$^+$pBpnWn$^+$ infrared photodiode in accordance with an embodiment of the invention.

To address the LWIR T2SL detector problems, various embodiments of the invention relate to an n$^+$pBpnWn$^+$ device structure. An example of an n$^+$pBpnWn$^+$ device structure is illustrated in FIG. 4. The structure of the n$^+$pBpnWn$^+$ device includes a unipolar electron barrier "B"

layer similar to that of the p⁺BpnWn⁺ structure described in connection with FIG. 3. As illustrated, the detector array 300 of FIG. 3 includes a p-type absorber layer 304 and an n-type absorber layer 306 on top of a wide band gap window 314 and a bottom contact layer 310. The primary difference between the ntpBpnWn⁺ structure and the p⁺BpnWn⁺ structure is in the introduction of an additional p-n junction above the unipolar electron barrier 302. In FIG. 3, the mesas in the p⁺BpnWn⁺ structure are delineated by etching to below the absorber p-n junction for electrical isolation of individual pixels in a detector array. In the case of the n⁺pBpnWn⁺ structure the mesa delineation etch does not need to extend to below the absorber p-n junction. It has been discovered that the additional p-n junction above the unipolar electron barrier 302 provides adequate electrical isolation of the adjacent pixels such that the n⁺pBpnWn⁺ structure does not need to be etched below the absorber p-n junction. In fact, it has been discovered that the absorber including the p-type absorber layer and the n-type absorber layer may remain completely unetched which may reduce the sources of exposed surface dark current described above.

FIG. 4 is a schematic of two adjacent pixels in a detector array 400 made from an n⁺pBpnWn⁺ infrared photodiode in accordance with an embodiment of the invention. The n⁺pBpnWn⁺ infrared photodiode may include a p-type absorber layer 402 and a n-type absorber layer 404. The p-type absorber layer 402 may be monolithic p-type absorber semiconductor layer. The ntpBpnWn⁺ infrared photodiode may include a unipolar electron barrier 406. Instead of the unipolar electron barrier 406 being in contact with a p-type top contact layer as in the case of the p⁺BpnWn⁺ structure described in connection with FIG. 3, a p-type recombination layer 412 is capped by an n-type top contact layer 410. The p-type recombination layer 412 forms a p-n junction with the n-type top contact layer 410. It has been discovered that by providing the p-type recombination layer 412 with the n-type top contact layer 410 instead of the p-type contact layer described in connection with the p⁺BpnWn⁺ structure of FIG. 3, that this provides adequate isolation of each of the pixels and thus does not require etching into the absorber p-n junction formed by the p-type absorber layer 402 and the n-type absorber layer 404.

The unipolar electron barrier 406 may be positioned between a first transition layer 414 and a second transition layer 408. The first transition layer 414 and the second transition layer 408 may be p-type semiconductor layers. The first transition layer 414 and the second transition layer 408 may provide smooth valence band connection between the unipolar electron barrier 406 and the p-type absorber layer 402 below and the p-type recombination layer 412 above.

An n-type window layer 416 may be interposed between the n-type absorber layer 404 and a n-type bottom contact layer 418. The pixel mesa etch depth in this n⁺pBpnWn⁺ detector array 400 may extend to below the unipolar electron barrier 406, but does not need to extend to below the p-n junction of the p-type absorber layer 402 and the n-type absorber layer 404. The pixel etch depth may form cavities in the p-type absorber layer 402 which do not extend beyond the p-type absorber layer 402 and thus the p-type absorber layer 402 may remain a monolithic p-type absorber semiconductor layer. The cavities overlap gaps between each of the n-type top contact layers 410 and the p-type recombination layer 412. As discussed above, etching through the n-type top contact layer 410 and the p-type recombination layer 412 provide adequate isolation so as to not require the etch depth to reach the bottom p-n junction.

A metal top contact 420 may be positioned above the top contact layer 410. An n-type exposed surface 422 may surround the top contact layer 410, the p-type recombination layer 412, the first transition layer 414, and the second transition layer 408. The n-type exposed surface 422 may surround the exposed surfaces of the p-type absorber region 402. As illustrated, the exposed surfaces of the p-type absorber region 402 may be fairly minimal. Further, the n-type exposed surface 422 does not form on the unipolar electron barrier 406 which may decrease surface dark current. The trenches between the pixels can be partially etched into the p-type absorber region 402. However, the reduced exposed absorber sidewall areas compared to the p⁺BpnWn⁺ structure of FIG. 3 may decrease surface dark current. It is also seen in FIG. 4 that the n-type surface 422 connection path between two adjacent pixels is severed by the unipolar electron barrier 406. This also contributes to the electrical isolation between adjacent pixels. The n-type bottom contact layer 418 may be in direct contact with a substrate 424.

In some embodiments, the mesa etch depth for the n⁺pBpnWn⁺ structure can extend just to, but not beyond, the unipolar electron barrier 406. In this "pseudo-planar" configuration, there may be no exposed absorber sidewall surfaces, and therefore surface dark current may be eliminated or at least greater reduced.

Figure 5:
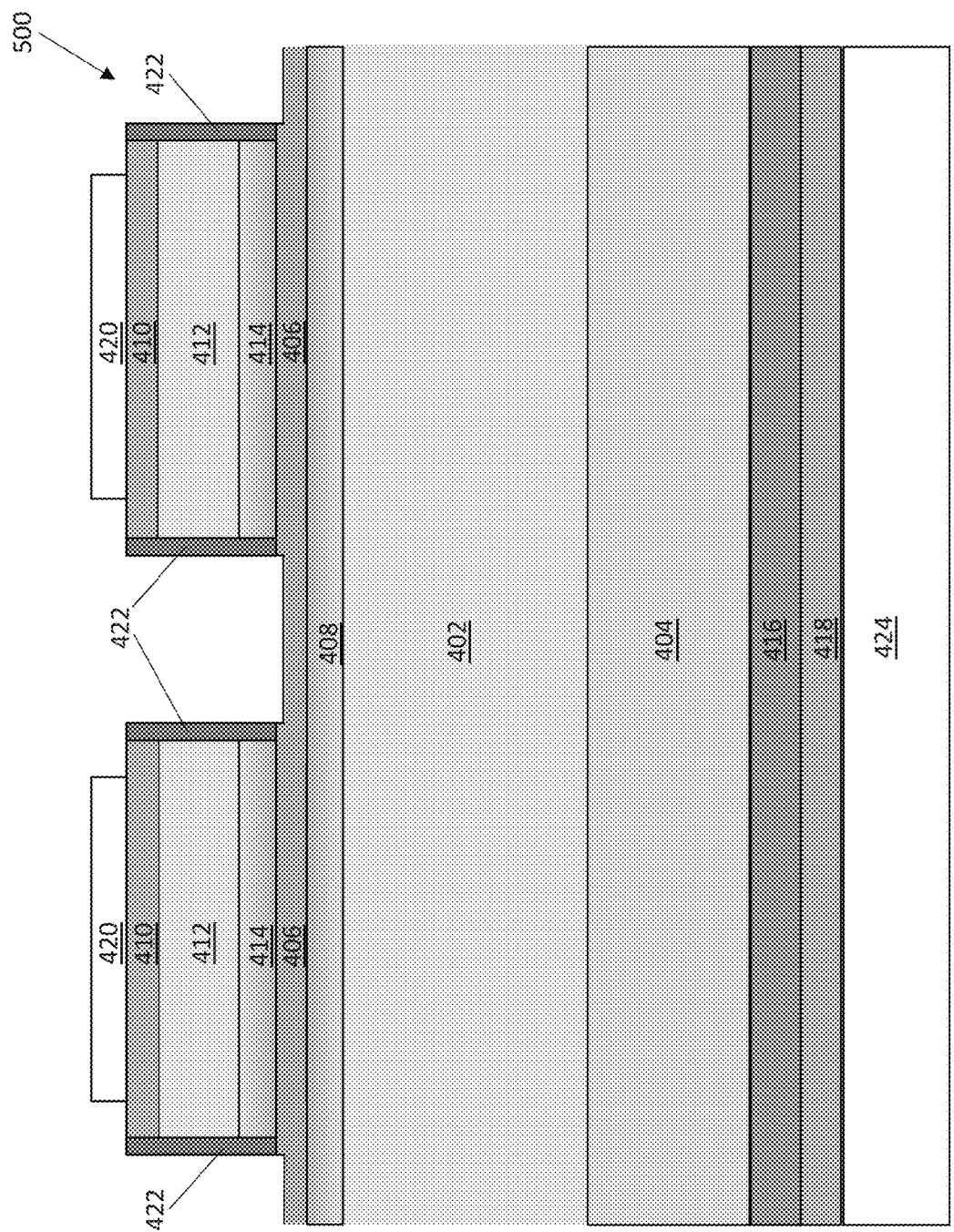
FIG. 5 is a schematic of two adjacent pixels in a detector array made from an n$^+$pBpnWn$^+$ infrared photodiode in accordance with an embodiment of the invention.

FIG. 5 is a schematic of two adjacent pixels in a detector array 500 made from an n⁺pBpnWn⁺ infrared photodiode in accordance with an embodiment of the invention. The detector array 500 includes many identically labeled elements as the detector array 400 described in connection with FIG. 4. The description from FIG. 4 is applicable to the detector array 500 of FIG. 5 and this description will not be repeated in detail. The pixel mesa etch depth in the n⁺pBpnWn⁺ detector array 500 extends into but not beyond the unipolar electron barrier layer 406. As illustrated, an n-type exposed surface 422 may contact the sidewalls of the top contact layer 410, the p-type recombination layer 412, and the first transition layer 414. However, the n-type exposed surface 422 does not contact the p-type absorber region 402 therefore surface dark current may be eliminated or at least greater reduced. FIG. 5 also shows that the connection path created by the n-type surface 422 between two adjacent pixels is severed by the electron unipolar barrier 406, thus contributing to the electrical isolation between adjacent pixels.

The pixel mesa etch depth in this n⁺pBpnWn⁺ detector array 500 may extend to the unipolar electron barrier 406, but not beyond the unipolar electron barrier 406. The pixel etch depth may form cavities in the unipolar electron barrier 406 which do not extend beyond the unipolar electron barrier 406 and thus the unipolar electron barrier 406 may remain a monolithic unipolar electron barrier. The cavities overlap gaps between each of the n-type top contact layers 410 and the p-type recombination layer 412. As discussed above, the p-type recombination layer 412 with the n-type top contact layer 410 provide adequate isolation so as to not require the etch depth to reach the bottom p-n junction.

In the p⁺BpnWn⁺ structure, the n-type absorber layer and the p-type absorber layer may provide sufficient total absorber thickness, while minimizing the etch depth, which may extend to below the p-n junction of the n-type absorber layer and the p-type absorber layer. The strategy is to make the n-type absorber layer as thick as its hole diffusion length would permit, and then to boost the quantum efficiency by adding as thick a p-type absorber layer as etch-depth considerations allow. One drawback of the p⁺BpnWn⁺ structures is the presence of a p-n homojunction at the n-type absorber layer and the p-type absorber layer, which is a source of generation-recombination (G-R) or depletion dark current due to the Shockley-Read-Hall (SRH) mechanism. The presence of a p-n homojunction with exposed pixel sidewall is also a source of surface dark current.

It was explained earlier that some benefits of having both the p-type and n-type absorbers in $p^+BpnWn^+$ structure, as compared to a similar structure with only a p-type absorber of the same total absorber thickness, are the reduced etch depth and the reduced area of exposed p-type absorber surface. In the $n^+pBpnWn^+$ structure, since we do not need to etch past the bottom p-n junction, these benefits are no longer relevant. It has been discovered that in the $n^+pBpnWn^+$ structure, since the device is not etched past the p-n junction of the n-type absorber layer and the p-type absorber layer, the n-type absorber does not need to be present and only a p-type absorber layer may be present.

Figure 6A:
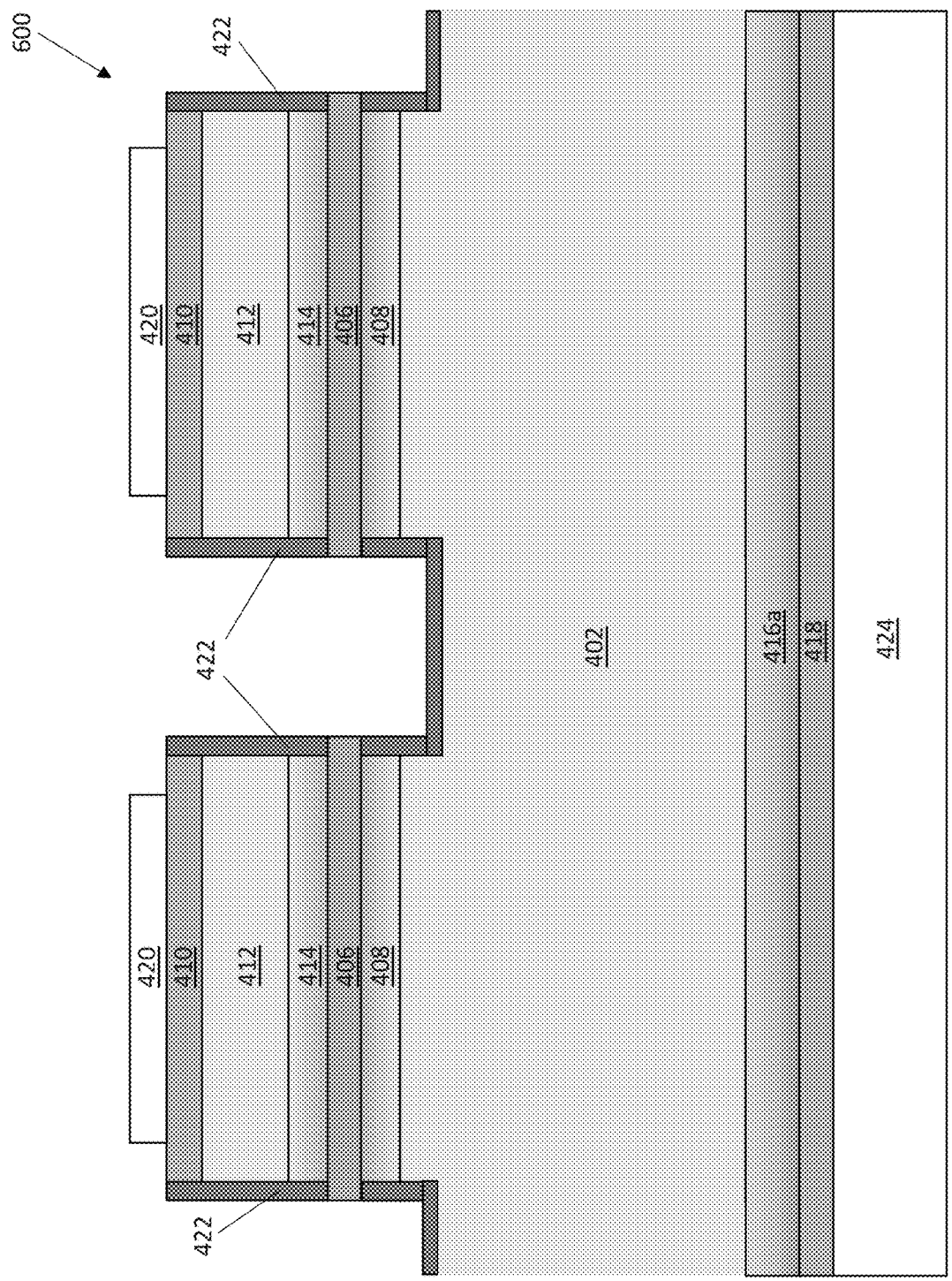
FIG. 6A is a schematic of two adjacent pixels in a detector array made from an n$^+$pBpWn$^+$ infrared photodiode in accordance with an embodiment of the invention.

FIG. 6A is a schematic of two adjacent pixels in a detector array 600 made from an $n^+pBpWn^+$ infrared photodiode in accordance with an embodiment of the invention. The detector array 600 includes many identically labeled elements as the detector array 400 described in connection with FIG. 4 and the detector array 500 described in connection with FIG. 5. The descriptions from FIGS. 4 and 5 are applicable to the detector array 600 of FIG. 6A and this description will not be repeated in detail. As illustrated, the absorber is entirely p-type and thus the n-type absorber layer 404 is not present. The detector array 600 merely includes a p-type absorber layer 402. The p-type absorber layer 402 positioned between the unipolar electron barrier 406 and a unipolar hole barrier/window layer 416a. The window layer 416a may be n-type, and thus forming a p-n junction at the interface between the p-type absorber layer 402 and the window layer 416a. Alternatively, in a junction-displacement configuration, the p-n junction is moved into the window layer. In the junction-displacement configuration the window layer 416a contains a p-n junction. The window layer 416a includes a p-type semiconductor layered on top of an n-type semiconductor to form a p-n junction. The doping profile in the window layer may be non-uniform. The n-type semiconductor may be in electrical contact with an n-type bottom contact layer 418. The pixel mesa etch depth in the $n^+pBpWn^+$ detector array 600 extends to below the unipolar electron barrier layer 406 into the p-type absorber layer 402, but does not need to extend past the p-n junction below the unipolar electron barrier 406. The p-type absorber layer 402 is directly on top of the window layer 416a and the n-type bottom contact layer 418. The window layer 416a may be a wide band gap layer. In the junction displacement configuration, the p-n junction is placed in the window layer 416a to reduce G-R and tunneling dark current.

Figure 6B:
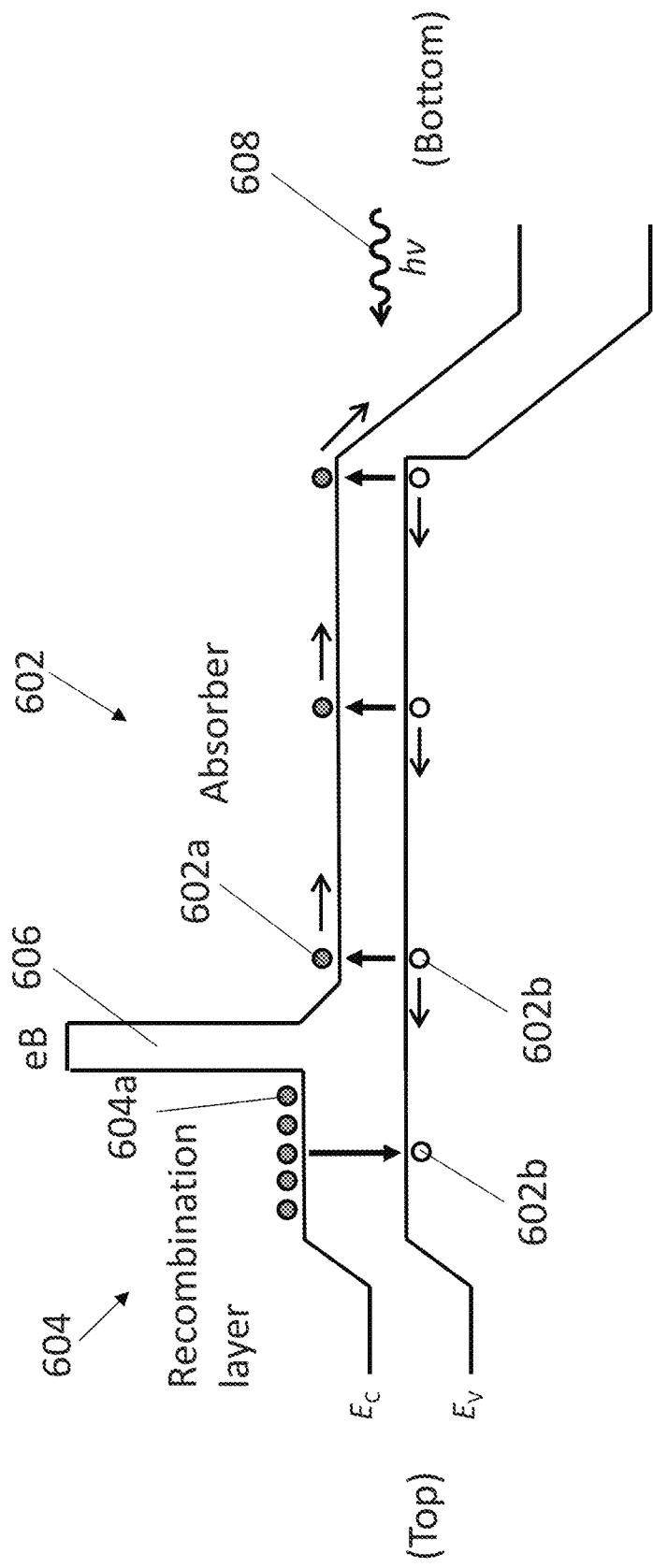
FIG. 6B illustrates an example band diagram of an n$^+$pBpWn$^+$ structure including a recombination layer in accordance with an embodiment of the invention.

FIG. 6B illustrates an example band diagram of an $n^+pBpWn^+$ structure including a recombination layer in accordance with an embodiment of the invention. The illustrated band diagram is merely exemplary to show the operation of the device of FIG. 6A. Further, the illustrated band diagram illustrates the operation of the combination of the recombination layer and the unipolar electron hole barrier which is applicable to the other related structures. A unipolar electron barrier 606 blocks the flow of electrons and allows the flow of holes. At a bottom absorber 602, the minority carriers are electrons 602a and the majority carriers are holes 602b. Light enters the detector from the bottom side, or the right-hand side in the figure. There are two p-n junctions in this device. The first is on top, or to the left, of the electron barrier, and the second is on bottom, or to the right, of the electron barrier. Under normal operation, the bottom p-n junction is reverse biased, and the top p-n junction is forward biased. Incident light 608 generate electron-hole pairs in the absorber 602, where the photo-generated electrons 602a flow to the right to be collected at a bottom contact, and the photo-generated holes 602b move to the left across the unipolar electron barrier 606 and enter the top section. The electrons 602a flow away from the unipolar electron barrier 606. The electrons 604a injected from the top p-n junction are blocked by the unipolar electron barrier 606, and accumulate in the recombination layer 604. The accumulated electrons 602a recombine with the holes 602b flowing across the unipolar electron barrier 606 into the recombination layer 604. The holes 602b can also recombine with electrons in the top p-n junction region. As illustrated, the absorber 602 may have a bandgap which is narrower than the recombination layer 604. In comparison, for dual-band detectors, the bottom absorber has a bandgap which is wider than the top absorber band gap.

As illustrated in FIG. 6A, the pixel etch depth can extend past the unipolar electron barrier 406 however not beyond the p-type absorber layer 402. In some embodiments, the pixel etch depth may be limited to the unipolar electron barrier 406 itself.

Figure 7:
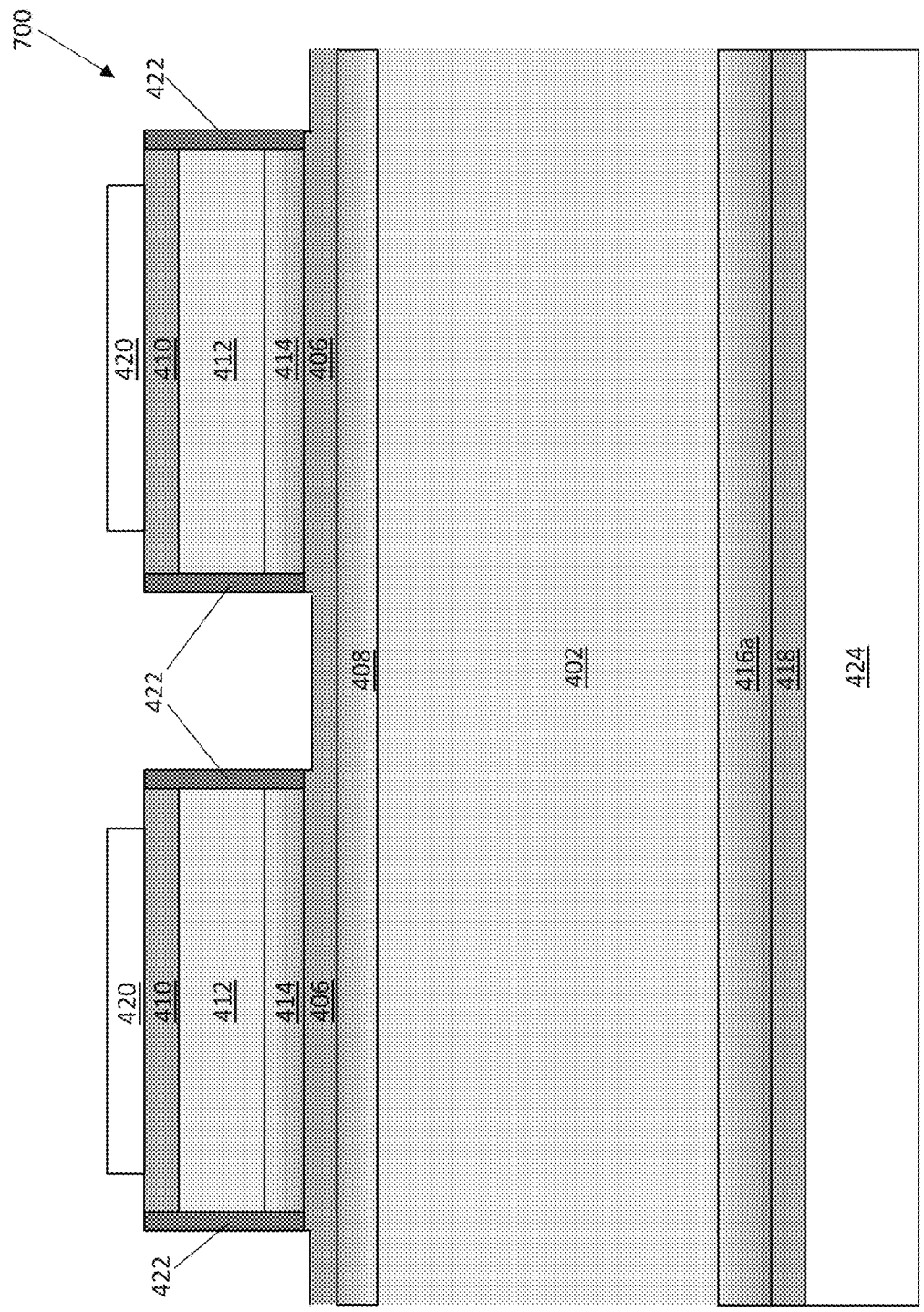
FIG. 7 is a schematic of two adjacent pixels in a detector array made from an n$^+$pBpWn$^+$ infrared photodiode in accordance with an embodiment of the invention.

FIG. 7 is a schematic of two adjacent pixels in a detector array 700 made from an $n^+pBpWn^+$ infrared photodiode in accordance with an embodiment of the invention. The detector array 700 includes many identically labeled elements as the detector array 600 described in connection with FIG. 6A. The description from FIG. 6A is applicable to the detector array 700 of FIG. 7 and this description will not be repeated in detail. As illustrated, the absorber is entirely p-type and thus the n-type absorber layer 404 is not present. The detector array 700 merely includes a p-type absorber layer 402. The p-type absorber layer 402 is positioned between the unipolar electron barrier 406 and a window layer 416a. A p-n junction is between the absorber layer 402 and the window layer 416a, or is contained within the window layer 416a. Similar to the detector array 500 described in connection with FIG. 5, the pixel mesa etch depth in the $n^+pBpWn^+$ detector array 700 may extend into but not beyond the unipolar electron barrier layer 406. Since the pixel etch does not expose any absorber surface, the $n^+pBpWn^+$ detector array 700 is also considered a pseudo-planar configuration.

The detector array structure may include a unipolar electron barrier 406 surrounded by a bottom section and a top section. Light may enter the detector structure through the bottom section side. Each of the bottom section and the top section contains a p-n junction, with the p-region being nearer to the unipolar electron barrier 406 than the n-region. In some embodiments, the detector array structure may be as follows: (1) top contact layer 410, (2) recombination layer 412, (3) unipolar electron barrier 406, (4) absorber layer 402,404, and (5) window layer 416 and/or bottom contact layer 418. For a pair of adjacent layers, a transition-regions may be inserted in-between to smooth out the connection band edge profile as desired. The top contact layer 410 may be n-type, and the recombination layer 412 may be p-type, although the top-section p-n junction could be placed within the recombination layer 412 itself. For example, the recombination layer 412 may include a p-type semiconductor layer and an n-type semiconductor layer with the n-type semiconductor layer in electrical connection with the top contact layer 410. Similarly, as shown in FIGS. 4 and 5, the bottom-section p-n junction could be placed within the absorber layer 402, 404, or, as shown in FIGS. 6A and 7 alternatively within the window region 416a. The bottom-section p-n junction could also be placed at the interface between the absorber layer 402 and the window layer 416a of FIGS. 6A and 7. The band gaps could be distinct for the different layers, and could even be graded. In particular, band gaps for the top contact, recombination, and window/bottom contact layers are typically larger than that of the absorber.

In some embodiments, the recombination layer 412 can be configured as a second absorber layer which may resemble various aspects of a dual-band structure. Examples of dual-band detector structures are described in U.S. Pat. No. 8,928,029, entitled "Single-Band and Dual-Band Infrared Detectors" and filed Dec. 12, 2012, and U.S. Pat. No. 9,799,785, entitled "Unipolar barrier dual-band infrared detectors" and filed Mar. 14, 2016, which are hereby incorporated by reference in their entireties. With a dual-band structure, a bottom absorber layer may include a wider bandgap than a top absorber layer. With a dual-band structure, the bottom absorber layer has a shorter cutoff wavelength than the top absorber layer. The bottom absorber layer is closer to the incident light than the top absorber layer. Thus, a shorter wavelength light of the incident light may be absorbed by the bottom absorber layer with longer wavelength light passing onto the top absorber layer. The bottom absorber layer and the top absorber layer are separated by a unipolar barrier layer.

In the n$^+$pBpnWn$^+$ and n$^+$pBpWn$^+$ photodiode detectors described in connection with FIGS. 4-7, the bottom absorber 402, 404 may have the narrower bandgap, or longer cutoff wavelength, than the top layers including recombination layer 412. Thus, the bottom absorber 402, 404 may absorb a longer wavelength light than the recombination layer 412. This may be the opposite of the arrangement in a bias-switchable dual-band detector, where the bottom absorber layer has wider band gap than the top absorber layer. In the n$^+$pBpnWn$^+$ and n$^+$pBpWn$^+$ photodiode detectors described in connection with FIGS. 4-7, light with wavelength between the cutoff wavelength $\lambda_1$ of the bottom absorber layer 402, 404 and the cutoff wavelength $\lambda_2$ of the recombination layer can be absorbed by the bottom absorber 402, 404, but not by the recombination layer 412. Light with a wavelength shorter than the cutoff wavelength $\lambda_2$ of the recombination layer 412 can be absorbed by both the bottom absorber 402, 404 and the recombination layer 412. Thus, depending on whether the absorption band of interest includes wavelengths shorter than the cutoff wavelength of the recombination layer 412, the recombination layer 412 may be transparent to some or all of the light the bottom absorber 402, 404 is designed to absorb.

In particular, incident light with wavelength between $\lambda_1$ and $\lambda_2$ that is not absorbed by the absorber 402, 404 in the first pass through may transmit through the recombination layer 412 without being significantly absorbed, reflect off the top metal reflector 420, pass back through recombination layer 412, and re-enter the absorber 402,404 for a second-pass absorption by the absorber 402, 404 which can enhance the quantum efficiency. For example, the bottom absorber 402, 404 with band gap Eg may have a cutoff wavelength given by $\lambda_{cutoff}$=1.24/Eg, where the cutoff wavelength is in the units of microns, and band gap in the units of eV. The bottom absorber 402, 404 may absorb light with a broad range of wavelengths, provided they are shorter than the cutoff wavelength. However, the light not absorbed by the recombination layer 412 and may reflect off the top contact layer 410 and/or the metal top contact 420 and have another chance of being absorbed by the bottom absorber 402, 404 which may provide better absorption for the bottom absorber 402, 404 which may increase quantum efficiency of the detector. Also, the recombination layer 412 may be thinner than the top absorber layer of a dual-band detector. For example, the thickness of a recombination layer 412 may be 1 micron or less. Effective top absorber layers for a dual-band detector would be 2 micron or more and preferably at least 3-4 microns.

Previous dual-band detector structures may be etched past the bottom absorber p-n junction for pixel isolation. It has been discovered that a dual-band structure including a top absorber layer above the unipolar electron barrier also provides electrical isolation to the separate pixels similar to the isolation provided by the top p-n junction between the recombination layer 412 and the n-type contact 410. Thus, the dual-band structures may also include a shallow etch above the bottom absorber 402, 404 similar to the n$^+$pBpnWn$^+$ and n$^+$pBpWn$^+$ photodiode detectors described in connection with FIGS. 4-7.

Figure 8:
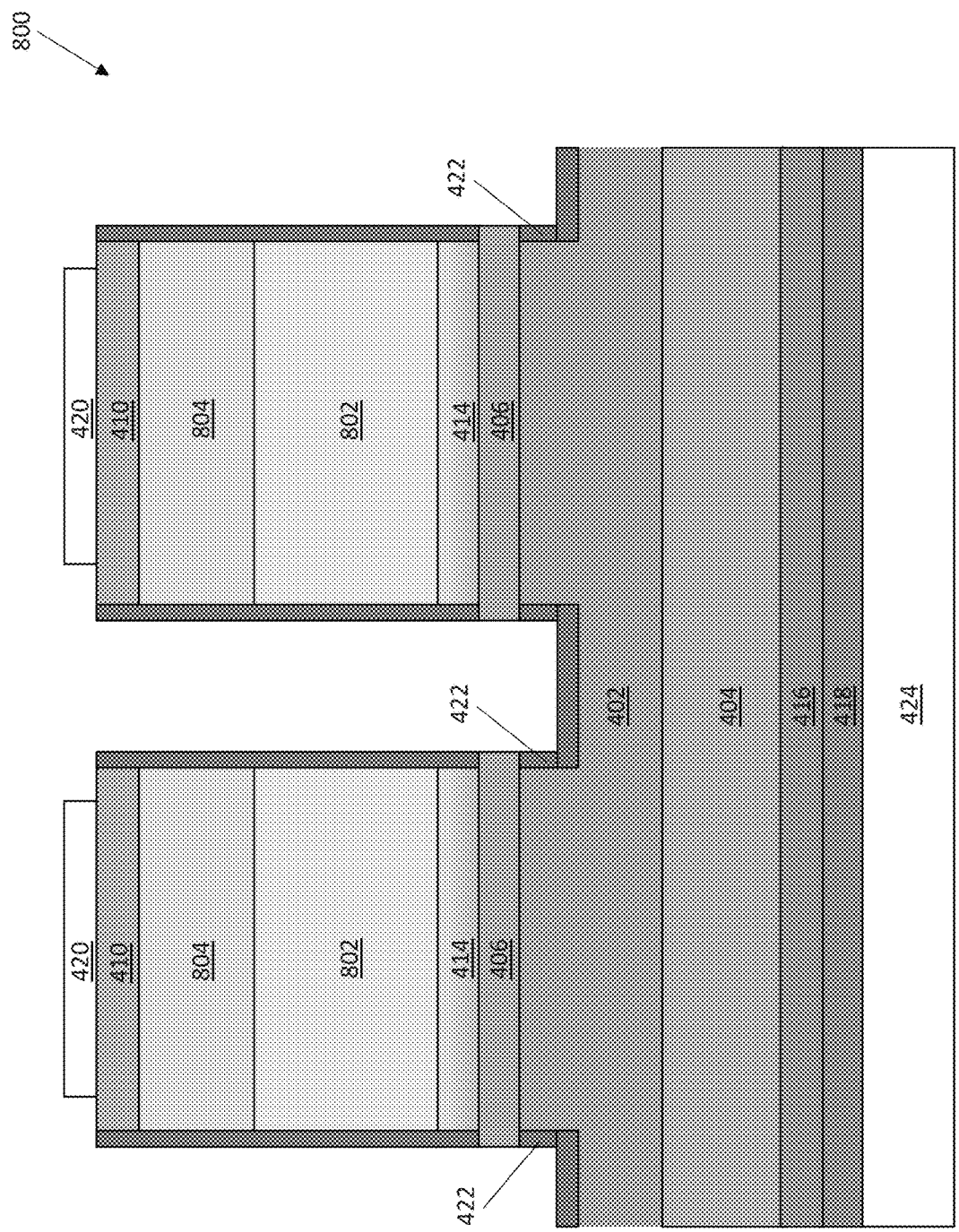
FIG. 8 is a schematic of two adjacent pixels in a detector array made from an n$^+$npBpnWn$^+$ dual-band infrared photodiode in accordance with an embodiment of the invention.
Figure 9:
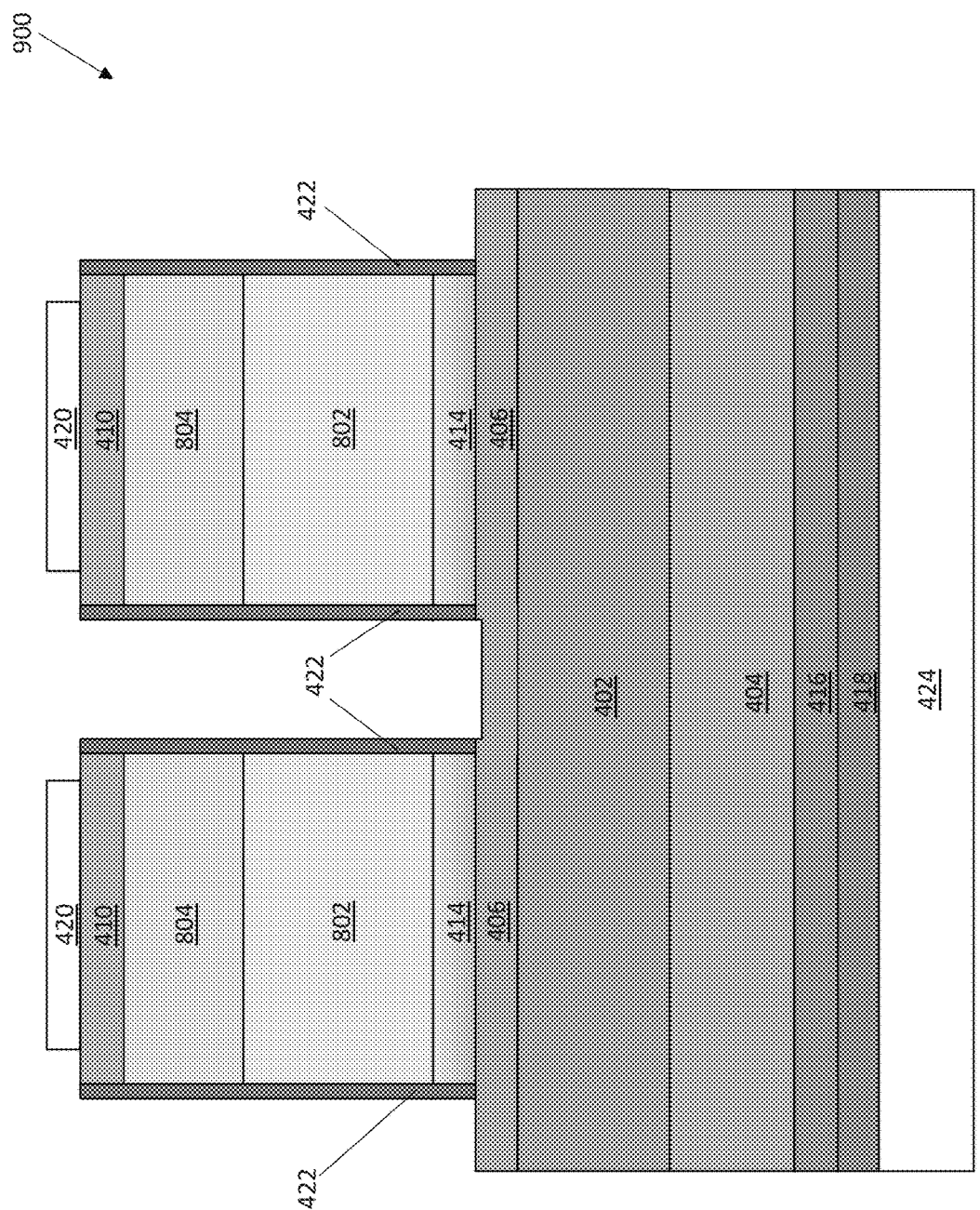
FIG. 9 is a schematic of two adjacent pixels in a detector array 900 made from an n$^+$npBpnWn$^+$ dual-band infrared photodiode in accordance with an embodiment of the invention.

FIGS. 8 and 9 shows examples of dual-band structures where the pixel etch does not extend below the bottom p-n junction. FIG. 8 is a schematic of two adjacent pixels in a detector array 800 made from an n$^+$npBpnWn$^+$ dual-band infrared photodiode in accordance with an embodiment of the invention. The detector array 800 includes many identically labeled elements as the detector array 400 described in connection with FIG. 4. The description from FIG. 4 is applicable to the detector array 800 of FIG. 8 and this description will not be repeated in detail. The detector array 800 may include a dual-band structure etched into a bottom p-type absorber 402 just below the unipolar electron barrier layer 406. Instead of a recombination layer 412, a top absorber is positioned between the top contact layer 410 and the unipolar electron barrier layer 406. The top absorber includes an n-type top absorber 804 and a p-type top absorber 802. The bottom absorber is positioned between the bottom contact layer 418 and the unipolar electron barrier layer 406. As with the detector array 400 described in connection with FIG. 4, the bottom absorber includes an n-type absorber 404 and a p-type absorber 402. Each of the absorber section contain both p-type and n-type absorber layers. The pixel mesa etch depth in the dual-band n$^+$npBpnWn$^+$ detector array 800 extends to below the unipolar electron barrier layer 406, but not below the p-n junction of the bottom absorber section including the n-type absorber 404 and the p-type absorber 402. Advantageously, as discussed above, this may reduce surface dark current.

A first transition layer 414 may be positioned between the top absorber and the unipolar electron barrier layer 406. A second transition layer 408 (shown in FIG. 4) may be positioned between the bottom absorber the unipolar electron barrier layer 406.

FIG. 9 is a schematic of two adjacent pixels in a detector array 900 made from an n$^+$npBpnWn$^+$ dual-band infrared photodiode in accordance with an embodiment of the invention. The detector array 900 includes many identically labeled elements as the detector array 800 described in connection with FIG. 8. The description from FIG. 8 is applicable to the detector array 900 of FIG. 9 and this description will not be repeated in detail. The detector array 900 includes a dual-band structure etched into, but not past, the unipolar electron barrier 406. As with the detector array 800 described in connection with FIG. 8, each of the absorber section contain both p-type and n-type absorber layers. The pixel mesa etch depth in the n$^+$npBpnWn$^+$ detector array 900 extends into but not beyond the unipolar electron barrier layer 406. As with the detector array 500 described in connection with FIG. 5, the detector array 900 includes an n-type semiconductor surface 422 which contacts the sidewalls of the top contact layer 410, the n-type top absorber 804, the p-type top absorber 802, and the first transition layer 414.

In some embodiments, a dual-band detector array may include a unipolar electron barrier surrounded by a bottom absorber section and a top absorber section, but only the bottom section contains both p-type and n-type absorbers. The top section may include only an n-type semiconductor layer, as in the n$^+$nBpnWn$^+$, or may include only a p-type semiconductor layer, as in the ntpBpnWnt. In some embodiments, a dual-band detector array may include a unipolar electron barrier surrounded by a bottom absorber section and a top absorber section, but the bottom section contains only p-type absorber, while the top absorber section may contain a p-type and/or an n-type absorber. This includes the n$^+$nBpWn$^+$, the n$^+$pBpWn$^+$, and the n$^+$npBpWn$^+$. In some embodiments, the mesa etch depth for the dual-band detectors may be either into the unipolar electron barrier 406 but not below (similar to the detector array 500 described in connection with FIG. 5), or past the unipolar electron barrier 406 but not below the bottom p-n junction (similar to the detector array 400 described in connection with FIG. 4).

While the n$^+$pBpnWn$^+$ and other detector array structures have been disclosed herein, their complementary structures have been contemplated. For example, instead of the n$^+$pBpnWn$^+$ structure with a unipolar electron barrier, various embodiments include a corresponding p$^+$nBnpWp$^+$ detector structure where "B" is a unipolar hole barrier instead of a unipolar electron barrier, and W is a unipolar electron barrier instead of a unipolar hole barrier. The same concepts as described above apply also to the n$^+$pBpWnt, n$^+$npBpnWn$^+$, n$^+$nBpnWn$^+$, n$^+$nBpWn$^+$, n$^+$pBpnWn$^+$, and n$^+$pBpWn$^+$ detector structures.

The detector array may be electrically connected to a silicon readout integrated circuit (ROIC) which may receive the signal from the detector array. Examples of detector arrays integrated with silicon ROIC circuits are described in Ting, David Z., et al. "Development of type-II superlattice long wavelength infrared focal plane arrays for land imaging." Infrared Physics & Technology 123 (2022): 104133, which is hereby incorporated by reference in its entirety for all purposes.

DOCTRINE OF EQUIVALENTS

While the above description contains many specific embodiments of the invention, these should not be construed as limitations on the scope of the invention, but rather as an example of one embodiment thereof. It is therefore to be understood that the present invention may be practiced in ways other than specifically described, without departing from the scope and spirit of the present invention. Thus, embodiments of the present invention should be considered in all respects as illustrative and not restrictive. Accordingly, the scope of the invention should be determined not by the embodiments illustrated, but by the appended claims and their equivalents.

What is claimed is:

1. An infrared detector array comprising:
    a plurality of pixels, wherein each pixel comprises:
        an n-type semiconductor top contact layer;
        a p-type semiconductor layer electrically connected to the n-type semiconductor top contact layer to form a top p-n junction;
        a unipolar electron barrier electrically connected to the p-type semiconductor layer;
        a bottom absorber, wherein the unipolar electron barrier is positioned between the p-type semiconductor layer and the bottom absorber; and
        an n-type semiconductor bottom contact layer electrically connected to the bottom absorber.

2. The infrared detector array of claim 1, wherein the bottom absorber comprises a p-type semiconductor absorber layer.

3. The infrared detector array of claim 2, wherein the bottom absorber further comprises a n-type semiconductor absorber layer which forms a p-n junction with the p-type semiconductor absorber layer.

4. The infrared detector array of claim 2, further comprising a window layer which is positioned between the p-type semiconductor absorber layer and the n-type semiconductor bottom contact layer.

5. The infrared detector array of claim 4, wherein the window layer comprising an n-type semiconductor window layer.

6. The infrared detector array of claim 5, wherein the window layer further comprises a p-type semiconductor window layer which forms a p-n junction with the n-type semiconductor window layer.

7. The infrared detector array of claim 1, wherein a first p-type transition layer is positioned between the p-type semiconductor layer and the unipolar electron barrier.

8. The infrared detector array of claim 7, wherein a second p-type transition layer is positioned between the unipolar electron barrier and the bottom absorber.

9. The infrared detector array of claim 1, wherein each n-type semiconductor top contact layer and p-type semiconductor layer are physically separated from each other.

10. The infrared detector array of claim 9, wherein each unipolar electron barrier are physically separated from each other.

11. The infrared detector array of claim 10, wherein each bottom absorber comprises a monolithic p-type absorber semiconductor layer.

12. The infrared detector array of claim 11, wherein the monolithic p-type absorber semiconductor layer comprises a plurality of cavities which do not extend beyond the monolithic p-type absorber semiconductor layer.

13. The infrared detector array of claim 12, wherein the plurality of cavities overlap with gaps between each n-type semiconductor top contact layer and p-type semiconductor layer.

14. The infrared detector array of claim 9, wherein each unipolar electron barrier combined to form a monolithic layer.

15. The infrared detector array of claim 14, wherein the monolithic layer comprises a plurality of cavities which do not extend beyond the monolithic layer.

16. The infrared detector array of claim 15, wherein the plurality of cavities overlap gaps between each n-type semiconductor top contact layer and p-type semiconductor layer.

17. The infrared detector array of claim 1, wherein the p-type semiconductor layer comprises a recombination layer and wherein the top p-n junction electrically isolates each pixel from adjacent pixels.

18. The infrared detector array of claim 17, wherein the absorber layer has a bandgap which is narrower than the recombination layer.

19. The infrared detector array of claim 17, wherein the recombination layer comprises a thickness of 1 micron or less.

20. A focal plane array comprising:
the infrared detector array of claim 1; and
a silicon readout integrated circuit electrically connected to the infrared detector array.

\* \* \* \* \*